United States Patent
Wakita et al.

(10) Patent No.: US 10,594,014 B2
(45) Date of Patent: Mar. 17, 2020

(54) CONNECTION STRUCTURE OF HIGH-FREQUENCY TRANSMISSION LINE

(71) Applicant: NIPPON TELEGRAPH AND TELEPHONE CORPORATION, Tokyo (JP)

(72) Inventors: Hitoshi Wakita, Tokyo (JP); Munehiko Nagatani, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 44 days.

(21) Appl. No.: 16/065,089

(22) PCT Filed: Dec. 22, 2016

(86) PCT No.: PCT/JP2016/088398
§ 371 (c)(1),
(2) Date: Jun. 21, 2018

(87) PCT Pub. No.: WO2017/111029
PCT Pub. Date: Jun. 29, 2017

(65) Prior Publication Data
US 2019/0020091 A1    Jan. 17, 2019

(30) Foreign Application Priority Data
Dec. 25, 2015  (JP) .................................. 2015-253491

(51) Int. Cl.
*H01P 5/08*    (2006.01)
*H03H 7/38*    (2006.01)
(Continued)

(52) U.S. Cl.
CPC .............. *H01P 5/085* (2013.01); *H01R 9/05* (2013.01); *H01R 13/62* (2013.01); *H01R 24/40* (2013.01);
(Continued)

(58) Field of Classification Search
CPC ........... H03H 7/38; H01P 5/085; H01R 13/62; H01R 12/51; H01R 12/52; H01R 12/59; H01R 12/61; H01R 12/62
(Continued)

(56) References Cited

U.S. PATENT DOCUMENTS 5,570,068 A    10/1996  Quan
2005/0191869 A1    9/2005  Oldfield et al.

FOREIGN PATENT DOCUMENTS

JP    H09-023108 A    1/1997

OTHER PUBLICATIONS

Supplementary European Search Report and Written Opinion received for EP Patent Application No. 16878916.2, dated Jun. 28, 2019, 9 pages.

(Continued)

*Primary Examiner* — Stephen E. Jones
(74) *Attorney, Agent, or Firm* — Womble Bond Dickinson (US) LLP

(57) ABSTRACT

A connection structure (3) of a high-frequency transmission line according to this invention includes a columnar central conductor (7) having one end connected to a coaxial line and the other end connected to a planar transmission line, a first outer conductor (41) arranged on a side of the one end of the central conductor coaxially with the central conductor, a first dielectric body (42) filled between the first outer conductor and the central conductor, a second outer conductor (61) arranged on a side of the other end of the central conductor coaxially with the central conductor, a second dielectric (Continued)

body (62) filled between the second outer conductor and the central conductor, a third outer conductor (51) arranged between the first outer conductor and the second outer conductor coaxially with the central conductor, and a third dielectric body (52) filled between the third outer conductor and the central conductor. In a direction perpendicular to each of an axial direction of the central conductor and a direction perpendicular to the planar transmission line, a shortest distance between the central conductor and the first outer conductor is longer than a shortest distance between the central conductor and the third outer conductor, and the shortest distance between the central conductor and the third outer conductor is longer than a shortest distance between the central conductor and the second outer conductor.

8 Claims, 10 Drawing Sheets

(51) Int. Cl.
| | | |
|---|---|---|
| *H01R 9/05* | (2006.01) | |
| *H01R 13/62* | (2006.01) | |
| *H01R 24/40* | (2011.01) | |
| *H01R 12/57* | (2011.01) | |
| *H01R 24/50* | (2011.01) | |
| *H01R 103/00* | (2006.01) | |

(52) U.S. Cl.
CPC .............. *H03H 7/38* (2013.01); *H01R 9/0515* (2013.01); *H01R 12/57* (2013.01); *H01R 24/50* (2013.01); *H01R 2103/00* (2013.01)

(58) Field of Classification Search
USPC ............... 333/33, 34, 246, 254, 260, 25, 26; 439/63
See application file for complete search history.

(56) References Cited

OTHER PUBLICATIONS

Written Opinion received for PCT Patent Application No. PCT/JP2016/088398, dated Mar. 14, 2017, 12 pages (7 pages of English Translation and 5 pages of Original Document).
Office Action received for Japanese Patent Application No. 2017-558268, dated Dec. 19, 2018, 6 pages (3 pages of English Translation and 3 pages of Office Action).
International Preliminary Report on Patentability received for PCT Patent Application No. PCT/JP2016/088398, dated Jul. 5, 2018, 15 pages (9 pages of English Translation and 6 pages of Original Document).
Eisenhart, "A Better Microstrip Connector", Microwave Symposium Digest, IEEE-MTT-S International, Jun. 27-29, 1978 p. 318-p. 320.
"International Search Report," International Application No. PCT/JP2016/088398 (dated Mar. 14, 2017).

CONNECTION STRUCTURE OF HIGH-FREQUENCY TRANSMISSION LINE

TECHNICAL FIELD

The present invention relates to a connection structure of a high-frequency transmission line and to, for example, a connection structure that connects a coaxial line and a planar transmission line.

BACKGROUND ART

There are known a coaxial line and a coplanar line as high-frequency transmission lines for transmission of a high-frequency signal such as a microwave or millimeter wave signal.

In a high-frequency transmission line, a single transmission line may be achieved by connecting different types of transmission lines. In such a case, it is necessary to connect the different types of transmission lines yet still suppressing deterioration in transmission characteristics. For example, non-patent literature 1 discloses a connection structure of an arrangement in which the axis of a signal line between a coaxial line and a coplanar line is continuously shifted toward the coplanar line from the center of the coaxial line.

RELATED ART LITERATURE

Non-Patent Literature

Non-Patent Literature 1: R. L. Eisenhart, "A BETTER MICROSTRIP CONNECTOR", Microwave Symposium Digest, IEEE-MTT-S International, 27-29 Jun. 1978 P. 318-P. 320.

DISCLOSURE OF INVENTION

Problem to be Solved by the Invention

However, the present inventors have found that the conventional connection structure of the coaxial line and the coplanar line described in non-patent literature 1 contains the following problems.

FIGS. 15 to 17 are views each showing the conventional connection structure. FIG. 15 shows the sectional shape of the side surface of a conventional connection structure 90 of a coaxial line and a coplanar line. FIG. 16 shows the sectional shape of the upper surface of the conventional connection structure 90. FIG. 17 shows the planar shape of the conventional connection structure 90 when viewed from a Y-axis direction. Note that in FIG. 17, a substrate 200, a connection block 8 for connecting the substrate 200 and a central conductor 7, and a metal member 10 are not illustrated.

As shown in FIGS. 15 to 17, the conventional connection structure 90 of the coaxial line and the coplanar line includes a coaxial mode block 91 connected to a coaxial line 1, and a coplanar mode block 92 connected to the coplanar line formed on the substrate 200. The coaxial mode block 91 is formed from the central conductor 7, as an inner conductor, having one end connected to the coaxial line 1 and the other end connected, via the pedestal 8, to the coplanar line formed on the substrate 200, a dielectric body 912 covering the central conductor 7, and an outer conductor 911 covering the dielectric body 912. The coplanar mode block 92 is formed from an outer conductor 921 having an elliptic hole formed by processing the metal member 10, and a dielectric body 922 filled between the hole of the outer conductor 921 and the central conductor 7.

The connection structure 90 shown in FIGS. 15 to 17 includes a boundary portion between the coaxial mode block 91 and the coplanar mode block 92, that is, edge regions 93A and 93B where the surface of the coaxial mode block 91 intersects the surface of the coplanar mode block 92. In the edge regions 93A and 93B, the surface of the metal member 10 contacting the coaxial mode block 91 is close to the surface of the outer conductor 921 of the coplanar mode block 92. Since, in the edge regions 93A and 93B, the areas of the surfaces close to each other are relatively large, an electric field is concentrated, and a mismatch between electromagnetic field modes occurs. This eventually causes a problem of parasitic capacitances generated in the edge regions 93A and 93B, and deterioration of the transmission characteristic between the coaxial line and the coplanar line.

Furthermore, when an electric field is concentrated in the edge regions 93A and 93B, this causes a problem of a return current that flows to the ground node (ground voltage) to bypass (reflect) in the edge regions 93A and 93B.

In addition, in the connection structure in which the axis of the signal line between the coaxial line and the coplanar line is continuously shifted toward the coplanar line from the center of the coaxial line, as described in the above non-patent literature 1, it is not easy to process the metal member for implementing a shape in which the axis of the signal line is continuously shifted.

The present invention has been made in consideration of the above problems, and has as its object to provide a connection structure of a high-frequency transmission line having excellent processability, which is also capable of suppressing deterioration in signal transmission characteristics.

Means of Solution to the Problem

According to the present invention, there is provided a connection structure of a high-frequency transmission line that connects a coaxial line and a planar transmission line, including a columnar central conductor having one end connected to an inner conductor of the coaxial line and the other end connected to the planar transmission line, a first outer conductor including a first hole that is formed coaxially with the central conductor and is larger than an outer diameter of the central conductor, and arranged on a side of the one end of the central conductor, a first dielectric body filled between the central conductor and the first outer conductor, a second outer conductor including a second hole that is formed coaxially with the central conductor and is larger than the outer diameter of the central conductor, and arranged on a side of the other end of the central conductor, a second dielectric body filled between the central conductor and the second outer conductor, a third outer conductor including a third hole that is formed coaxially with the central conductor and is larger than the outer diameter of the central conductor, and arranged between the first outer conductor and the second outer conductor, and a third dielectric body filled between the central conductor and the third outer conductor, wherein in a direction perpendicular to each of an axial direction of the central conductor and a direction perpendicular to the planar transmission line, a shortest distance between the central conductor and the first outer conductor is longer than a shortest distance between the central conductor and the third outer conductor, and the shortest distance between the central conductor and the third outer conductor is longer than a shortest distance between the central conductor and the second outer conductor.

Effect of the Invention

According to the present invention, it is possible to provide a connection structure of a high-frequency transmission line having excellent processability, which is also capable of suppressing deterioration in signal transmission characteristics.

Figure 1:
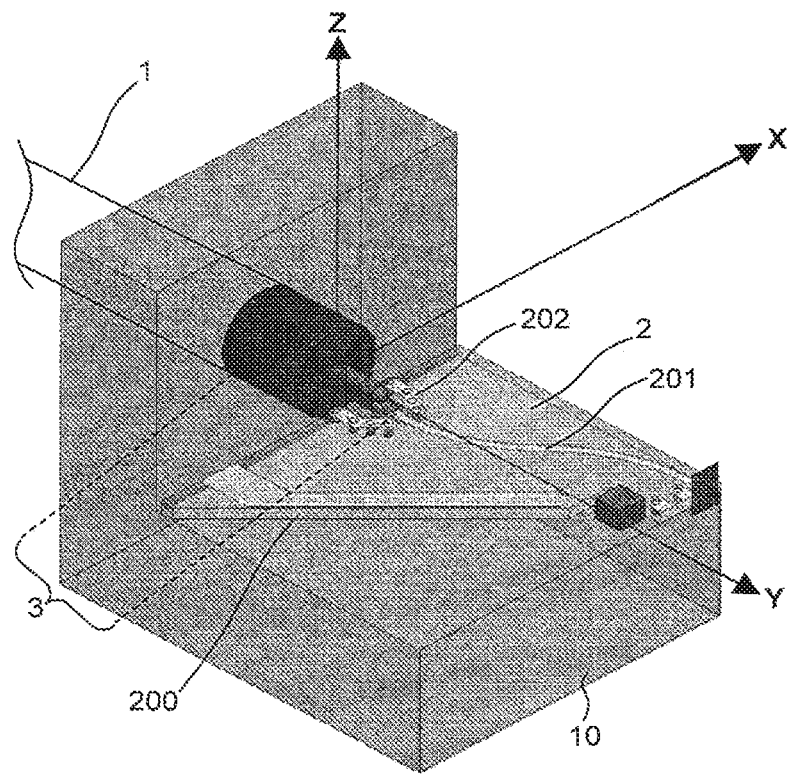
FIG. 1 is a perspective view schematically showing a connection structure of a high-frequency transmission line according to the first embodiment.

BEST MODE FOR CARRYING OUT THE INVENTION (1) Outline of Embodiment

An outline of a pressure sensor according to the present invention will be described first. Note that in the following description, constituent elements in drawings corresponding to those of the present invention are denoted by reference numerals in parentheses, as an example.

According to the present invention, there is provided a connection structure (3; 13; 23) of a high-frequency transmission line that connects a coaxial line (1) and a planar transmission line (2), including a columnar central conductor (7) having one end connected to an inner conductor of the coaxial line and the other end connected to the planar transmission line, a first outer conductor (41) including a first hole (10A) that is formed coaxially with the central conductor and is larger than an outer diameter of the central conductor, and arranged on a side of the one end of the central conductor, a first dielectric body (42) filled between the central conductor and the first outer conductor, a second outer conductor (61; 63) including a second hole (10B) that is formed coaxially with the central conductor and is larger than the outer diameter of the central conductor, and arranged on a side of the other end of the central conductor, a second dielectric body (62) filled between the central conductor and the second outer conductor, a third outer conductor (51; 53) including a third hole (10C) that is formed coaxially with the central conductor and is larger than the outer diameter of the central conductor, and arranged between the first outer conductor and the second outer conductor in an axial direction (Y direction) of the central conductor, and a third dielectric body (52) filled between the central conductor and the third outer conductor, wherein in a direction (X direction) perpendicular to each of the axial direction of the central conductor and a direction (Z direction) perpendicular to the planar transmission line, a shortest distance between the central conductor and the first outer conductor is longer than a shortest distance between the central conductor and the third outer conductor, and the shortest distance between the central conductor and the third outer conductor is longer than a shortest distance between the central conductor and the second outer conductor.

In the connection structure of the high-frequency transmission line, the second outer conductor (61) and the third outer conductor (51) are integrally formed by a single metal member (10).

In the connection structure of the high-frequency transmission line, the third dielectric body (52) is air.

In the connection structure of the high-frequency transmission line, the third hole is formed from a plurality of holes (10G, 10H) having different sizes and arranged in the axial (Y) direction of the central conductor.

(2) Practical Examples of Embodiment

Practical embodiments of the present invention will be described next with reference to the accompanying drawings.

First Embodiment

FIGS. 1 to 4 are views each schematically showing a connection structure of a high-frequency transmission line according to an embodiment of the present invention.

Figure 2:
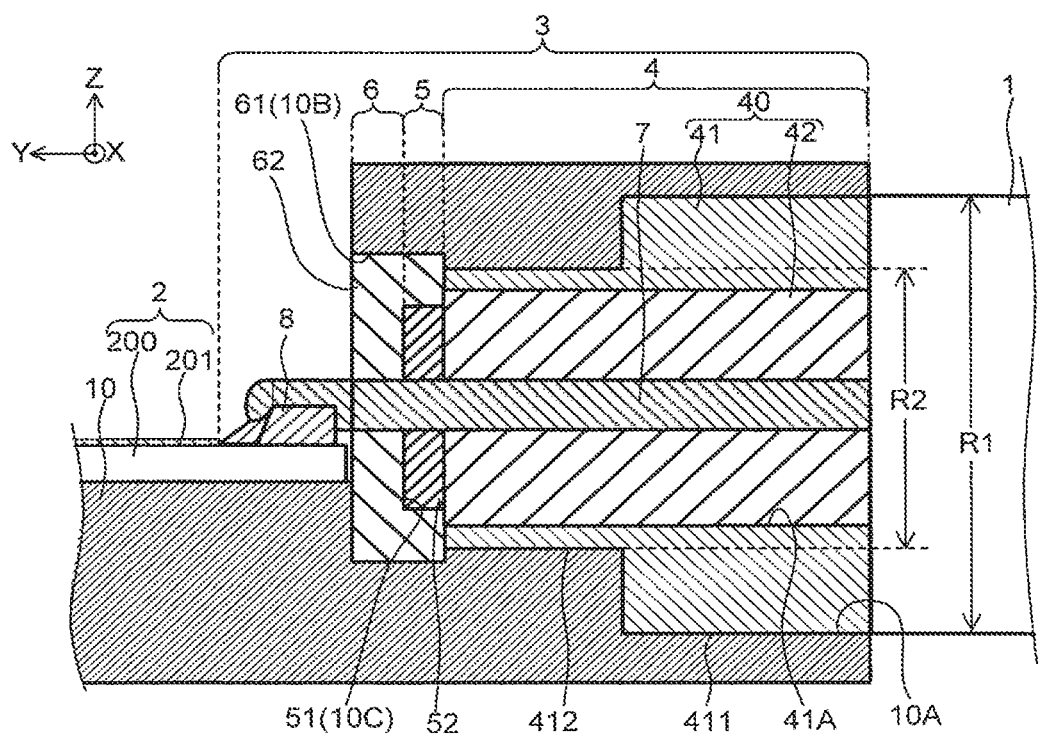
FIG. 2 is a view showing the sectional shape of the side surface of the connection structure of the high-frequency transmission line according to the first embodiment.
Figure 3:
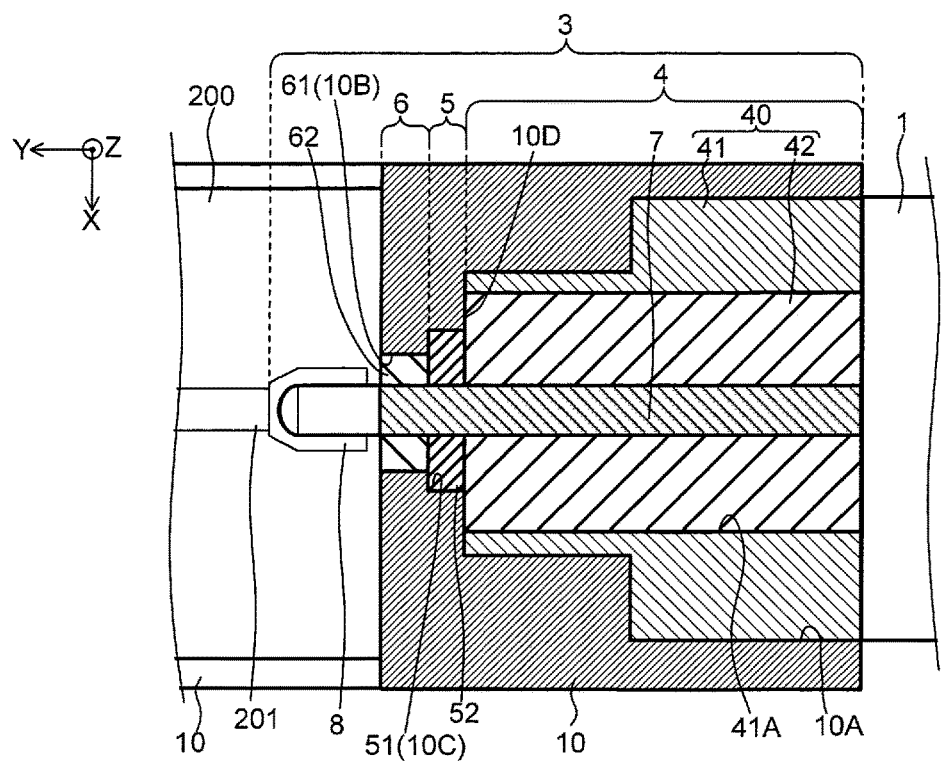
FIG. 3 is a view showing the sectional shape of the upper surface of the connection structure of the high-frequency transmission line according to the first embodiment.
Figure 4:
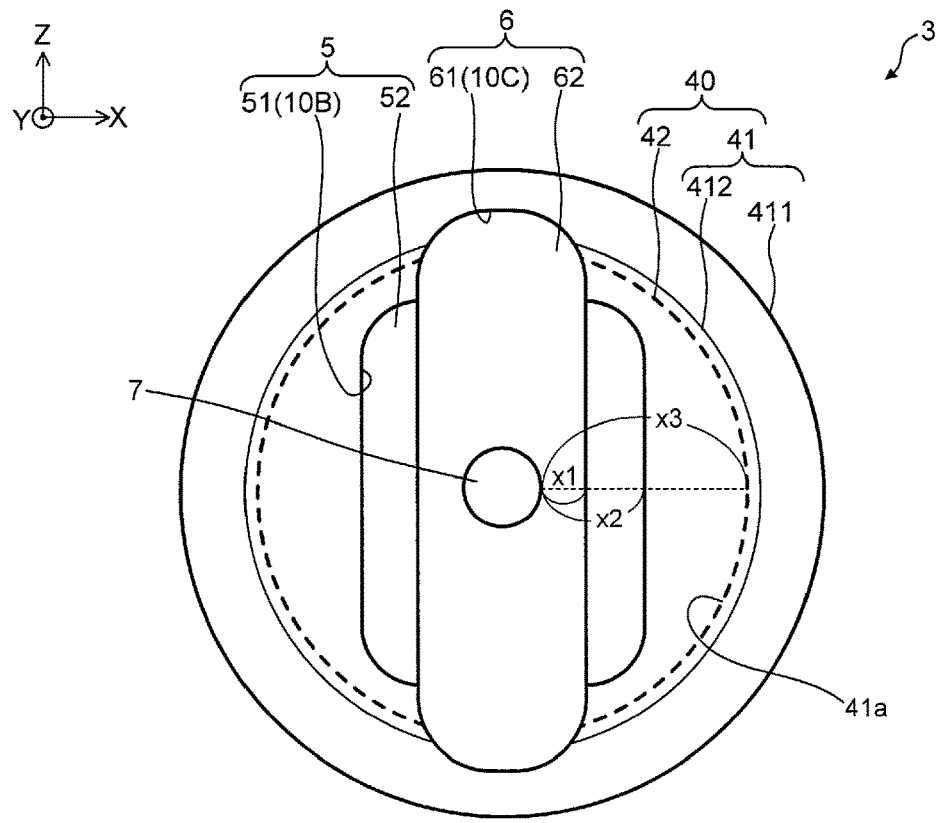
FIG. 4 is a front view showing the connection structure of the high-frequency transmission line according to the first embodiment.
Figure 5A:
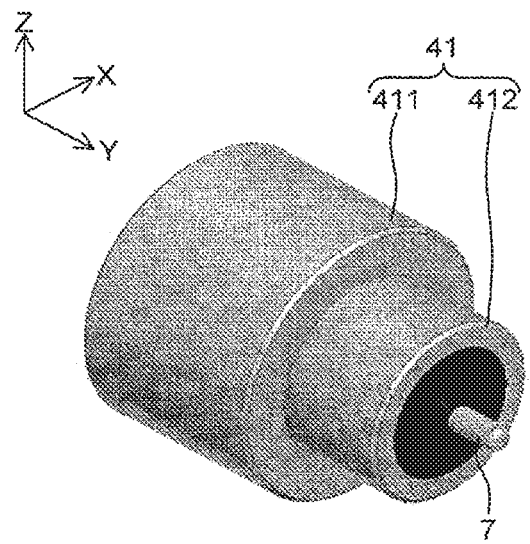
FIG. 5A is a perspective view showing the structure of a connector.
Figure 5B:
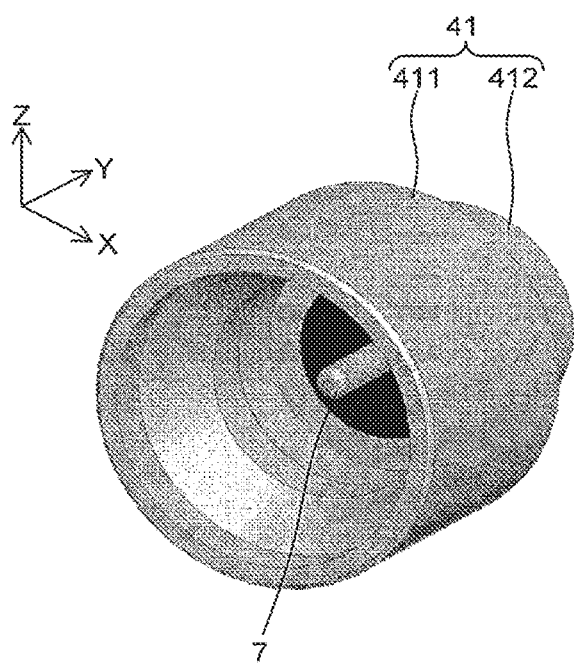
FIG. 5B is another perspective view showing the structure of the connector.
Figure 6A:
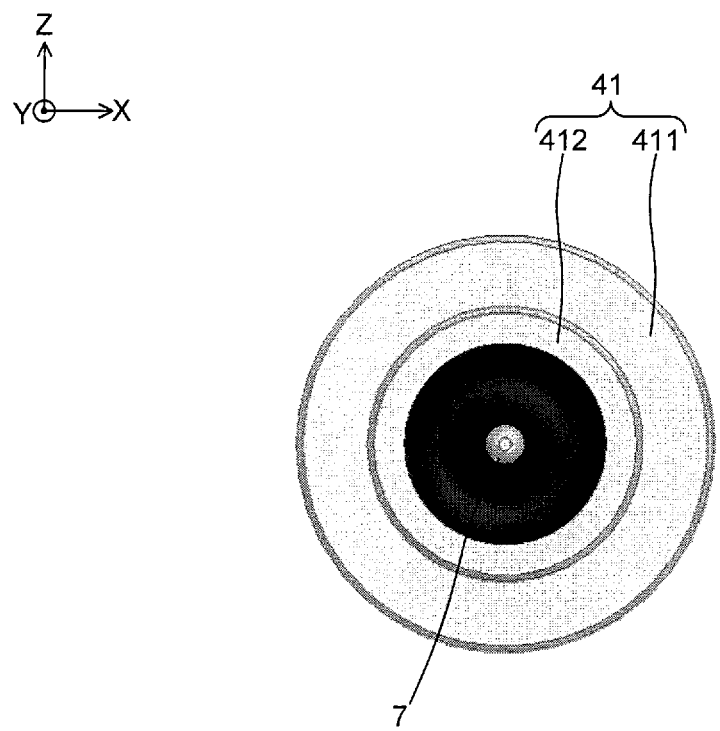
FIG. 6A is a front view showing the structure of the connector.
Figure 6B:
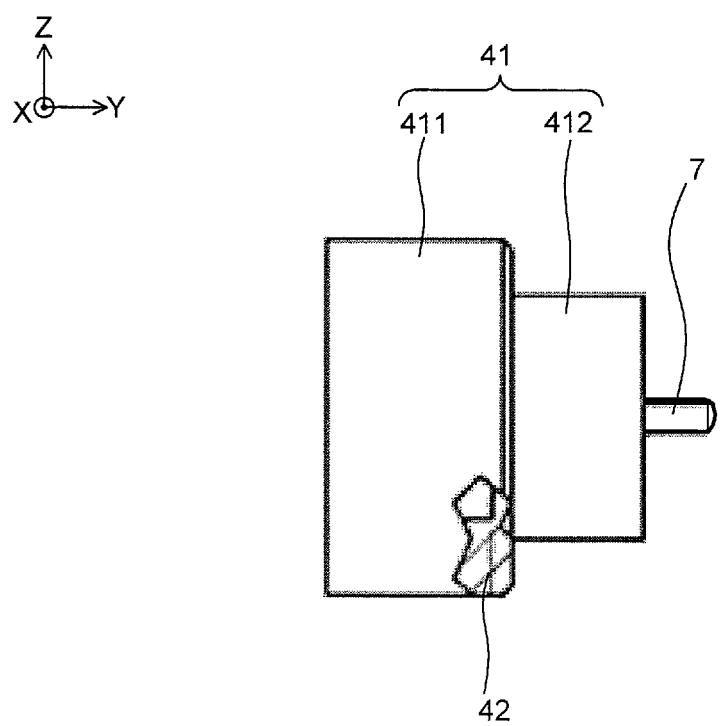
FIG. 6B is a side view showing the structure of the connector.

FIG. 1 is a perspective view schematically showing a connection structure 3 of a high-frequency transmission line according to the first embodiment. FIG. 2 shows a sectional shape viewed from an X-axis direction when cutting the connection structure 3 of the high-frequency transmission line along a Y-Z axial plane. FIG. 3 shows a sectional shape viewed from a Z-axis direction when cutting the connection structure 3 of the high-frequency transmission line along an X-Y axial plane. FIG. 4 shows the planar shape of the connection structure 3 of the high-frequency transmission line when viewed from a Y-axis direction. Note that in FIG. 4, a substrate 200, a pedestal 8, and a metal member 10 are not illustrated.

The connection structure 3 of the high-frequency transmission line shown in FIGS. 1 to 4 is a connection structure between different types of transmission lines, that relays the different types of transmission lines, and is, for example, a connection structure for relaying a coaxial line 1 and a planar transmission line 2 as high-frequency transmission lines each for transmitting a high-frequency signal such as a microwave or millimeter wave signal.

The coaxial line 1 is a transmission line obtained by coaxially arranging an inner conductor and an outer conductor to sandwich a dielectric body, and is, for example, a high-frequency coaxial cable. Note that in FIGS. 1 to 4, the internal structure of the coaxial line 1 is not illustrated.

The planar transmission line 2 is a transmission line obtained by patterning a signal wiring 201 and a ground wiring 202, both of which are made of a metal, on the substrate 200 formed from a dielectric body, and is, for example, a coplanar line or a microstrip line. Examples of the dielectric body forming the substrate 200 can be alumina, quartz, or a resin.

In this embodiment, it is assumed that the planar line 2 is a coplanar line, and the ground wiring 202 is formed around the signal wiring 201 on the substrate 200.

More specifically, the connection structure 3 of the high-frequency transmission line according to the first embodiment has a structure in which the metal member 10 is provided with a coaxial mode block 4 electrically connected to the coaxial line 1, a coplanar mode block 6 electrically connected to the planar transmission line 2, and a buffer block 5 arranged between the coaxial mode block 4 and the coplanar mode block 6.

The metal member 10 is made of a conductive material, and serves as the base of the connection structure 3 of the high-frequency transmission line while supporting the planar transmission line 2. Examples of the material of the metal member 10 can be metallic materials such as copper (Cu), aluminum (Al), and kovar.

The coaxial mode block 4 includes a central conductor 7, an outer conductor 41, and a dielectric body 42.

The central conductor 7 is made of a columnar conductive material having one end connected to the inner conductor of the coaxial line 1 and the other end connected to the signal wiring 201 of the planar transmission line 2. An example of the above material can be a metallic material such as copper or kovar.

The outer conductor 41 is coaxially spaced apart from the central conductor 7 on the one end side of the central conductor 7, that is connected to the coaxial line 1. More specifically, the outer conductor 41 includes a hole 41A that is formed coaxially with the central conductor 7 and is larger than the outer diameter of the central conductor 7, and is arranged on the one end side of the central conductor 7.

Similarly to the central conductor 7, the outer conductor 41 is made of a conductive metallic material such as copper or kovar.

As shown in, for example, FIGS. 2 to 4, the outer conductor 41 is formed from a first tubular portion 411 having an outer diameter R1 corresponding to the coaxial line 1, and a second tubular portion 412 that is joined to the first tubular portion 411 in the axial direction of the central conductor 7 and has an outer diameter R2 smaller than the outer diameter R1 of the first tubular portion 411.

The dielectric body 42 is filled between the central conductor 7 and the outer conductor 41. An example of the dielectric body 42 can be a glass material (for example, a relative dielectric constant: about 4.0).

As shown in, for example, FIGS. 5A, 5B, 6A, and 6B, the central conductor 7, the outer conductor 41, and the dielectric body 42 form one connector 40. For example, by inserting the connector 40 into a hole 10A that is formed in advance in the metal member 10 in accordance with the shape of the connector 40, the coaxial mode block 4 is disposed in the metal member 10.

The coplanar mode block 6 includes an outer conductor 61 and a dielectric body 62.

The outer conductor 61 is coaxially spaced apart from the central conductor 7 on the other end side (the side of the planar transmission line 2) of the central conductor 7. More specifically, the outer conductor 61 includes a hole 10B that is formed coaxially with the central conductor 7 and is larger than the outer diameter of the central conductor 7, and is arranged on the other end side of the central conductor 7.

In this embodiment, as an example, by forming the hole 10B in the metal member 10, a partial region of the metal member 10, where the hole 10B is formed, is used as the outer conductor 61.

As shown in, for example, FIG. 4, the hole 10B of the outer conductor 61 is formed into a rectangular shape in which the length in the Z-axis direction is longer than that of in the X-axis direction when viewed from the Y-axis direction. More specifically, the hole 10B is formed into a rectangular shape having four rounded corners.

The dielectric body 62 is filled between the central conductor 7 and the outer conductor 61. Similarly to the dielectric body 42, an example of the dielectric body 62 can be a glass material.

The buffer block 5 includes an outer conductor 51 and a dielectric body 52.

The outer conductor 51 is coaxially spaced apart from the central conductor 7 between the outer conductors 41 and 61 in the axial direction of the central conductor 7. More specifically, the outer conductor 51 includes a hole 10C that is formed coaxially with the central conductor 7 and is larger than the outer diameter of the central conductor, and is arranged between the outer conductors 41 and 61.

In this embodiment, as an example, by forming the hole 10C in the metal member 10, a partial region of the metal member 10, where the hole 10C is formed, is used as the outer conductor 51, similarly to the outer conductor 61.

As shown in, for example, FIG. 4, the hole 10C of the outer conductor 51 is formed into a rectangular shape in which the length in the Z-axis direction is longer than that of in the X-axis direction when viewed from the Y-axis direction. More specifically, the hole 10C is formed into a rectangular shape having four rounded corners.

The dielectric body 52 is filled between the central conductor 7 and the outer conductor 51. The dielectric body 52 has a relative dielectric constant lower than that of the dielectric body 42. For example, the dielectric body 52 is air (relative dielectric constant: about 1.0), and forms a coaxial tube (a coaxial line having a so-called air coaxial structure) together with the central conductor 7 and the outer conductor 51. Note that a fluororesin (relative dielectric constant: 2.0 to 3.0) can be used as the dielectric body 52, instead of air.

As shown in FIG. 4, the buffer block 5 is arranged in a region inside the coaxial mode block 4 when viewed from the axial direction (Y-axis direction) of the central conductor 7. More specifically, the dielectric body 52 of the buffer block 5 is arranged inside a region filled with the dielectric body 42 when viewed from the Y-axis direction.

As shown in FIG. 4, at least part of the coplanar mode block 6 is arranged in a region inside the buffer block 5 when viewed from the axial direction (Y-axis direction) of the central conductor 7. More specifically, at least part of the dielectric body 62 of the coplanar mode block 6 is arranged inside a region filled with the dielectric body 52 forming the buffer block 5 when viewed from the Y-axis direction. That is, two end portions in the Z-axis direction of the elliptic coplanar mode block 6 are arranged inside the buffer block 5 when viewed from the Y-axis direction. On the other hand, two end portions in the Z-axis direction of the elliptic coplanar mode block 6 are arranged outside the buffer block 5.

As shown in FIG. 4, when, in a direction (X direction) perpendicular to each of the axial direction (Y direction) of the central conductor 7 and a direction (Z direction) perpendicular to the planar transmission line 2, a shortest distance between the central conductor 7 and the outer conductor 41 (the inner wall surface of the outer conductor 41 contacting the dielectric body 42), that of between the central conductor 7 and the outer conductor 51, and that of between the central conductor 7 and the outer conductor 61 are represented by x1, x2, and x3, respectively, x3<x2<x1 holds.

That is, the buffer block 5 and the coplanar mode block 6 are arranged so that the lengths in the X-axis direction (widthwise direction) of the outer conductors 41, 51, 61 in a signal path from the coaxial mode to the coplanar mode gradually decrease.

As described above, when the coaxial mode block 4 (connector 40) and the coplanar mode block 6 are arranged along a signal propagation direction (Y-axis direction) to sandwich the buffer block 5, a surface 10D contacting the coaxial mode block 4 of the metal member 10 and the surface (the inner wall of the hole 10B of the metal member 10) of the outer conductor 61 of the coplanar mode block 6 are spaced apart from each other. Thus, it is possible to prevent an electric field from being concentrated at the boundary between the coaxial mode block 4 (connector 40) and the coplanar mode block 6. This can prevent generation of a parasitic capacitance at the boundary and the occurrence of bypassing, at the boundary, of a return current to the ground node.

The thickness of the buffer block 5, that is, the length in the Y-axis direction of the dielectric body 52 need only be a length that can suppress generation of a parasitic capacitance at the boundary between the coaxial mode block 4 (connector 40) and the coplanar mode block 6. More specifically, the length need only be ¼ wavelength of an electromagnetic wave used for transmission or less. When, for example, the electromagnetic wave has a frequency of 90 GHz, the length need only fall within the range of, for example, 0.15 mm to 0.75 mm.

Figure 7:
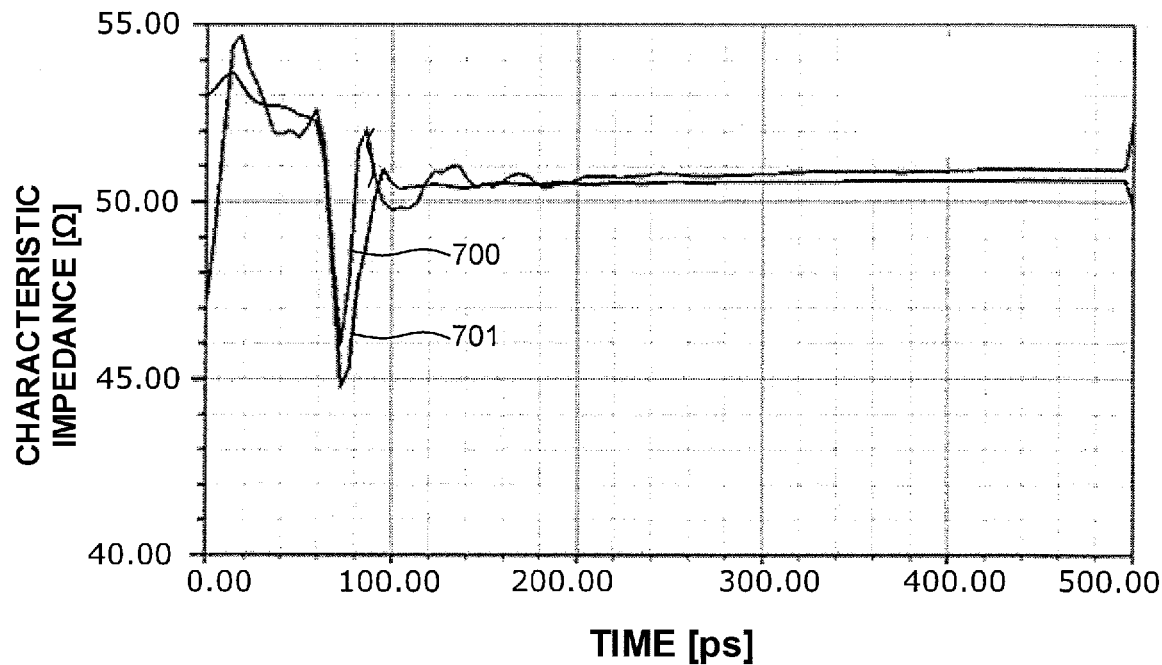
FIG. 7 is a timing chart showing a transmission characteristic simulation result of the connection structure of the high-frequency transmission line according to the first embodiment.
Figure 8:
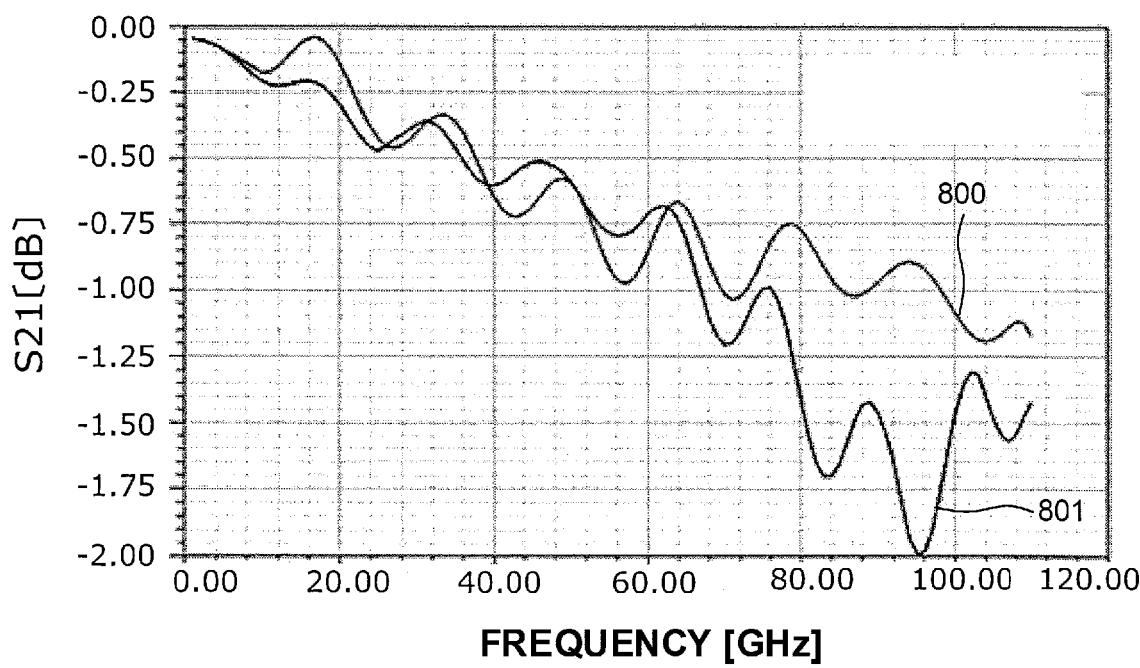
FIG. 8 is a graph showing another transmission characteristic simulation result of the connection structure of the high-frequency transmission line according to the first embodiment.

FIGS. 7 and 8 each show a transmission characteristic simulation result of the connection structure according to this embodiment.

FIG. 7 shows a TDR (Time Domain Reflectometry) simulation result 700 of the connection structure 3 of the high-frequency transmission line according to the first embodiment, and a TDR simulation result 701 of the conventional connection structure 90 as a comparative example. In FIG. 7, the abscissa represents time [ps] and the ordinate represents a characteristic impedance [Ω].

FIG. 8 shows a transmission characteristic simulation result 800 of the connection structure 3 of the high-frequency transmission line according to the first embodiment, and a transmission characteristic simulation result 801 of the conventional connection structure 90 as a comparative example. The abscissa represents a frequency [GHz] and the ordinate represents S21 [dB] of S-parameters.

In the simulations shown in FIGS. 7 and 8, the connection structure 3 that connects the coaxial line 1 and the planar transmission line (coplanar line) 2 shown in FIG. 1 is used as a simulation model, kovar is used as the metallic material of the central conductor 7, outer conductor 41, and metal member 10 (outer conductors 51 and 61), air is used as the dielectric body 52 (thickness: 0.15 mm) of the buffer block 5, and a glass material having a relative dielectric constant of about 4.0 is used as the dielectric bodies 42 and 62.

As will be understood from FIGS. 7 and 8, the connection structure 3 according to the first embodiment can improve the transmission characteristic, as compared to the conventional connection structure 90, by providing the buffer block 5 to suppress generation of a parasitic capacitance between the coaxial mode block 4 (connector 40) and the coplanar mode block 6. Especially, as shown in FIG. 8, it is possible to suppress deterioration in transmission characteristic at a frequency of 80 GHz or higher, as compared to the conventional connection structure 90.

As described above, the connection structure 3 of the high-frequency transmission line according to the first embodiment is configured such that the buffer block 5 is provided between the coaxial mode block 4 and the coplanar mode block 6 and the lengths in the X-axis direction (widthwise direction) of the outer conductors 41, 51, and 61 in the signal path from the axial mode to the coplanar mode gradually decrease. That is, in the connection structure 3 of the high-frequency transmission line according to the first embodiment, the coaxial mode block 4 and the coplanar mode block 6 are connected via the buffer block 5 having an intermediate mode between the coaxial mode and the coplanar mode, instead of directly switching between the coaxial mode in which an electromagnetic field spreads radially and the coplanar mode in which an electromagnetic field spreads in the horizontal direction. This can prevent an electric field from being concentrated at the boundary between the coaxial mode block 4 and the coplanar mode block 6, thereby preventing generation of a parasitic capacitance at the boundary and the occurrence of bypassing, at the boundary, of a return current to the ground node.

Therefore, the connection structure 3 of the high-frequency transmission line according to the first embodiment can suppress deterioration in transmission characteristic, as compared to the above-described conventional connection structure 90.

In the connection structure 3 of the high-frequency transmission line according to the first embodiment, it is not necessary to form a shape in which the center of the coplanar mode block 6 is shifted from the coaxial mode block 4, unlike the connection structure disclosed in non-patent literature 1. Therefore, it is easy to process the metal member 10 when forming the coplanar mode block 6 and the coaxial mode block 4, thereby providing a connection structure with excellent processability.

Especially, it becomes easy to process the holes 10B and 10C of the outer conductors 51 and 61 by forming the outer conductors 51 and 61 into a rectangular shape. For example, when forming the hole 10C, the hole 10C can be readily formed by inserting a drill in a direction (Y-axis direction) perpendicular to the X-Z plane of the metal member 10 and shifting it in the Z-axis direction to cut the metal member 10. The same applies to the hole 10B.

Furthermore, it may be easier to design the high-frequency transmission line by forming the outer conductors 51 and 61 into a rectangular shape, that is, a shape having straight lines. For example, it may be easier to adjust the characteristic impedance to a desired value (for example, 50Ω).

Second Embodiment

Figure 9:
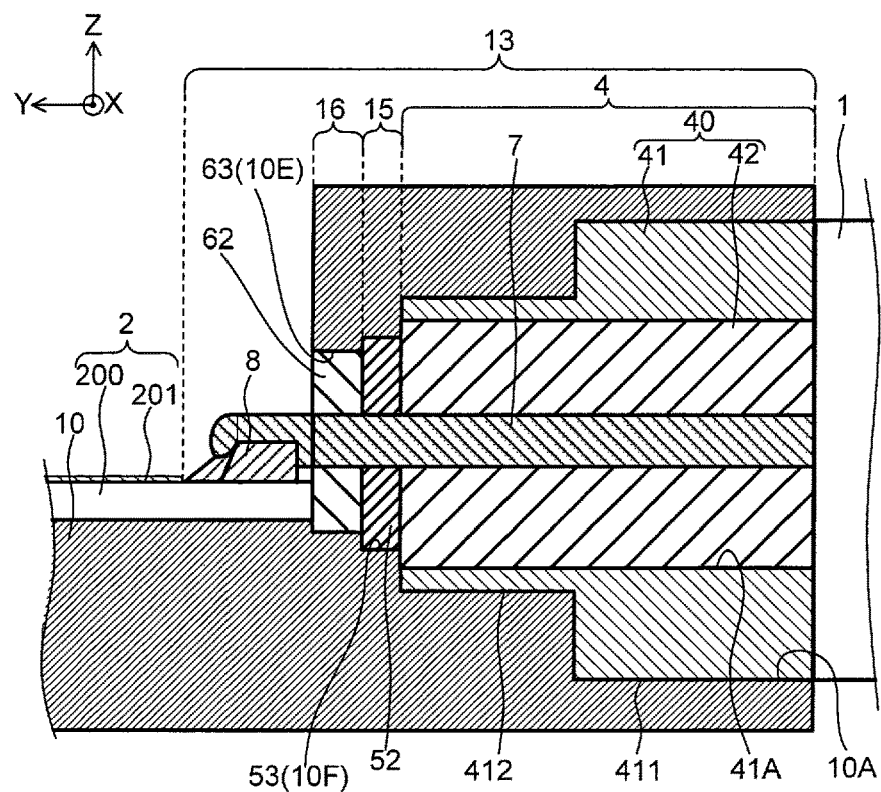
FIG. 9 is a view showing the sectional shape of the side surface of a connection structure of a high-frequency transmission line according to the second embodiment.
Figure 10:
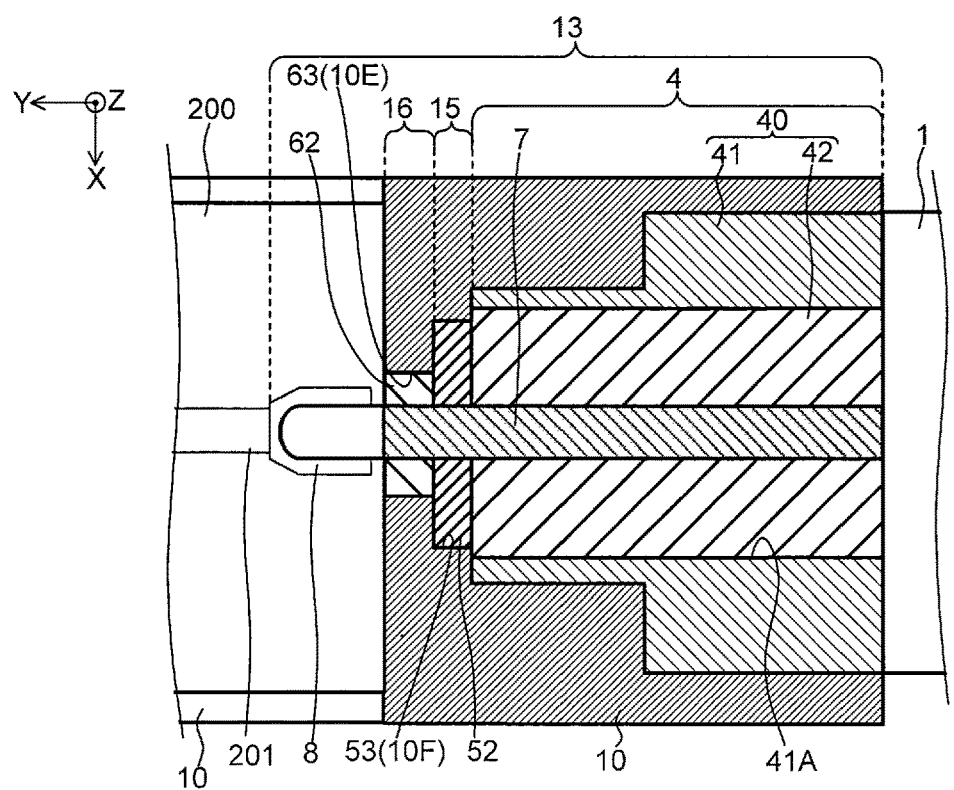
FIG. 10 is a view showing the sectional shape of the upper surface of the connection structure of the high-frequency transmission line according to the second embodiment.
Figure 11:
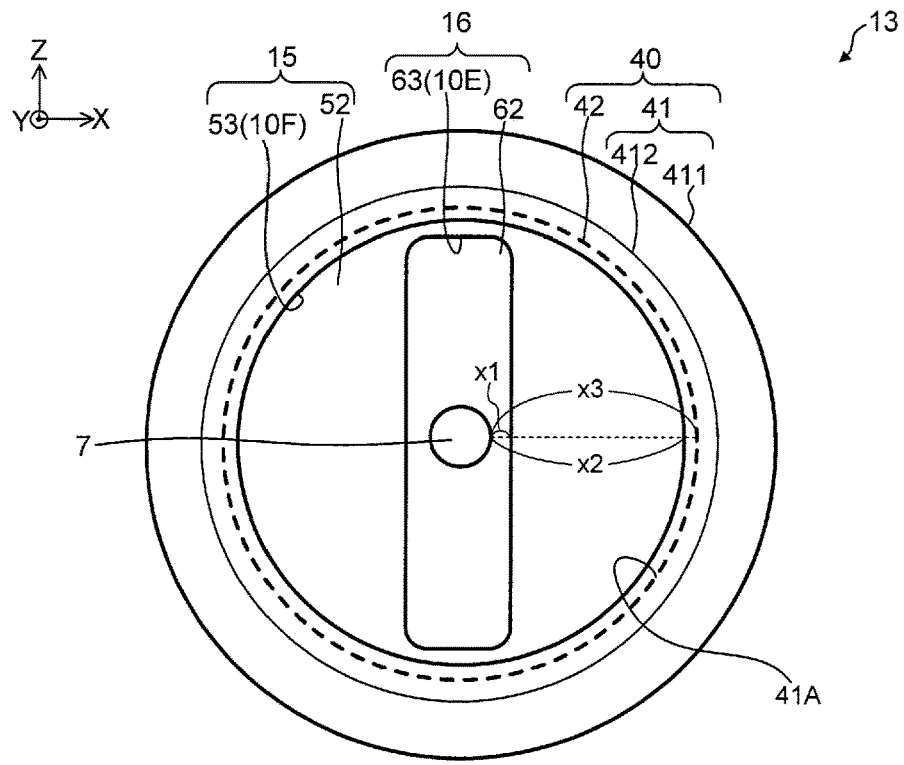
FIG. 11 is a front view showing the connection structure of the high-frequency transmission line according to the second embodiment.

FIGS. 9 to 11 are views each showing a connection structure of a high-frequency transmission line according to the second embodiment.

FIG. 9 shows a sectional shape viewed from an X-axis direction when cutting a connection structure 13 of the high-frequency transmission line along a Y-Z axial plane. FIG. 10 shows a sectional shape viewed from a Z-axis direction when cutting the connection structure 13 of the high-frequency transmission line along an X-Y axial plane. FIG. 11 shows the planar shape of the connection structure 13 of the high-frequency transmission line when viewed from a Y-axis direction. Note that in FIG. 11, a substrate 200, a pedestal 8, and a metal member 10 are not illustrated.

The connection structure 13 of the high-frequency transmission line according to the second embodiment is different from the connection structure 3 of the high-frequency transmission line according to the first embodiment in terms of the arrangements of a buffer block and a coplanar mode block. The remaining structures are the same as in the connection structure 3 of the high-frequency transmission line according to the first embodiment. Note that in the connection structure 13 according to the second embodiment, the same reference numerals as in the connection structure 3 according to the first embodiment denote the same constituent elements and a detailed description thereof will be omitted.

A buffer block 15 includes an outer conductor 53 and a dielectric body 52.

The outer conductor 53 is coaxially spaced apart from a central conductor 7 between outer conductors 41 and 63 in the axial direction of the central conductor 7. More specifically, the outer conductor 53 includes a hole 10F that is formed coaxially with the central conductor 7 and is larger than the outer diameter of the central conductor 7, and is arranged between the outer conductors 41 and 63.

In the second embodiment, as an example, by forming the hole 10F in the metal member 10, a partial region of the metal member 10, where the hole 10F is formed, is used as the outer conductor 53, similarly to the outer conductor 51 according to the first embodiment. The dielectric body 52 is filled between the outer conductor 53 and the central conductor 7.

As shown in, for example, FIG. 11, the hole 10F is formed into a circular shape when viewed from the Y-axis direction. More specifically, when viewed from the Y-axis direction, the hole 10F (dielectric body 52) has a circular shape with a diameter smaller than that of a hole 10A of a coaxial mode block 4 (the outer circumferential circle of a dielectric body 42), and is arranged inside a region filled with the dielectric body 42 of the coaxial mode block 4.

A coplanar mode block 16 includes an outer conductor 63 and a dielectric body 62.

The outer conductor 63 is coaxially spaced apart from the central conductor 7 on the other end side (the side of a planar transmission line 2) of the central conductor 7. More specifically, the outer conductor 63 includes a hole 10E that is larger than the outer diameter of the central conductor 7, and the other end of the central conductor 7 is arranged coaxially with the hole 10E in the hole 10E.

In this embodiment, as an example, by forming the hole 10E in the metal member 10, a partial region of the metal member 10, where the hole 10E is formed, is used as the outer conductor 63, similarly to the outer conductor 61 according to the first embodiment. The dielectric body 62 is filled between the outer conductor 63 and the central conductor 7.

For example, as shown in FIG. 11, the hole 10E (dielectric body 62) is formed into a rectangular shape when viewed from the Y-axis direction. More specifically, the hole 10E (dielectric body 62) has a rectangular shape with four rounded corners when viewed from the Y-axis direction, and is arranged inside a region filled with the dielectric body 52 of the buffer block 15.

Similarly to the buffer block 5, the thickness of the buffer block 15 need only be a length that can suppress generation of a parasitic capacitance at the boundary between the coaxial mode block 4 (a connector 40) and the coplanar mode block 6.

Similarly to the high-frequency transmission line according to the first embodiment, the buffer block 15 and the coplanar mode block 16 are arranged so that the lengths in the X-axis direction (widthwise direction) of the outer conductors 41, 53, 63 in a signal path from the coaxial mode to the coplanar mode gradually decrease. More specifically, as shown in FIG. 11, when, in a direction (X direction) perpendicular to each of the axial direction (Y direction) of the central conductor 7 and a direction (Z direction) perpendicular to the planar transmission line 2, a shortest distance between the central conductor 7 and the outer conductor 41, that of between the central conductor 7 and the outer conductor 53, and that of between the central conductor 7 and the outer conductor 63 are represented by x1, x2, and x3, respectively, x3<x2<x1 holds.

As described above, similarly to the connection structure 3 according to the first embodiment, the connection structure 13 according to the second embodiment is configured so that the coaxial mode block 4 (connector 40) and the coplanar mode block 6 are arranged to sandwich the buffer block 15 in the Y-axis direction and the lengths in the X-axis direction (widthwise direction) of the outer conductors 41, 53, and 63 in the signal path from the axial mode to the coplanar mode gradually decrease. This can prevent an electric field from being concentrated at the boundary between the coaxial mode block 4 and the coplanar mode block 6, thereby suppressing deterioration in transmission characteristic, as compared to the above-described conventional connection structure 90.

Third Embodiment

Figure 12:
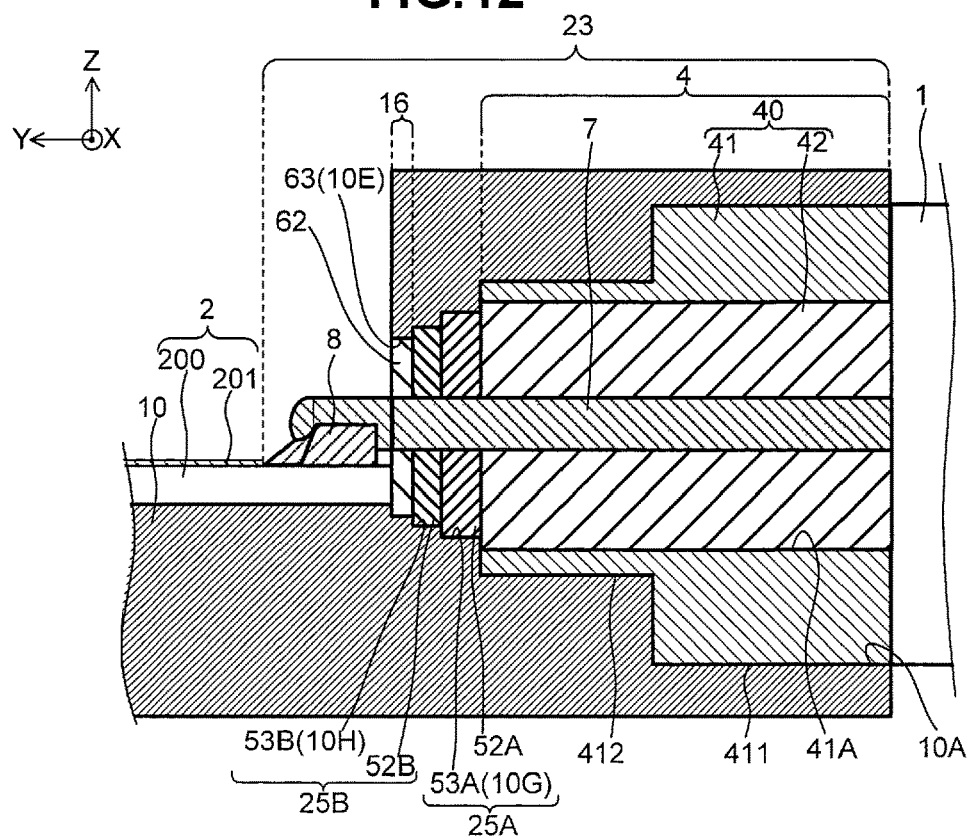
FIG. 12 is a view showing the sectional shape of the side surface of a connection structure of a high-frequency transmission line according to the third embodiment.
Figure 13:
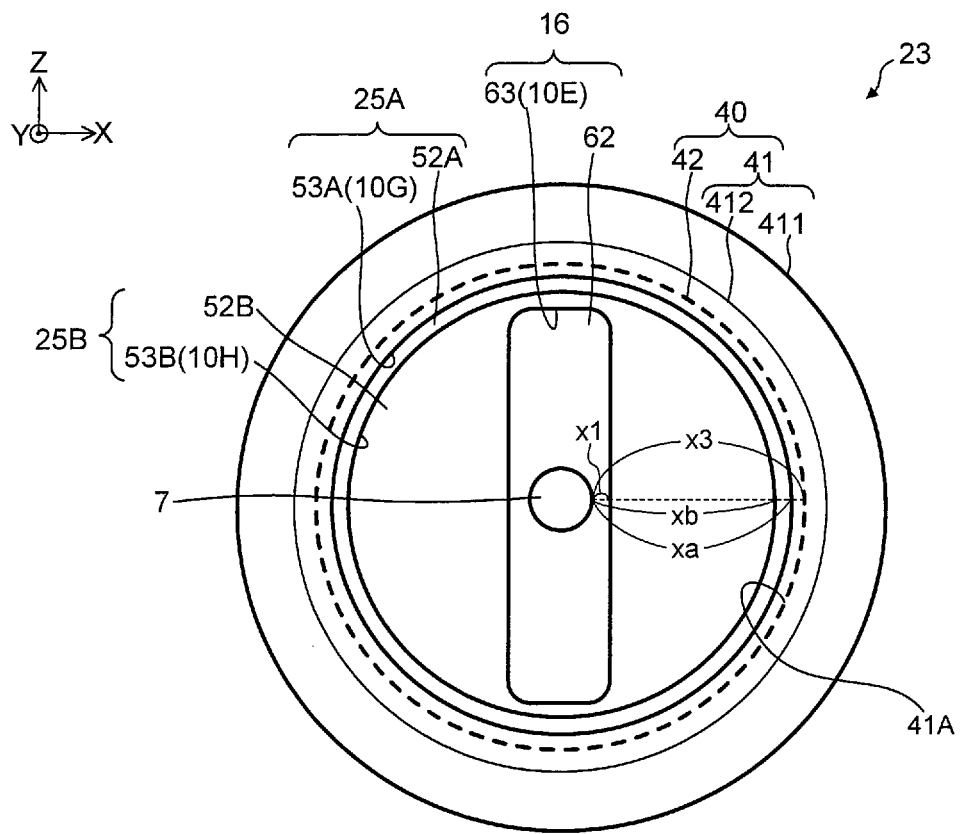
FIG. 13 is a front view showing the connection structure of the high-frequency transmission line according to the third embodiment.
Figure 14:
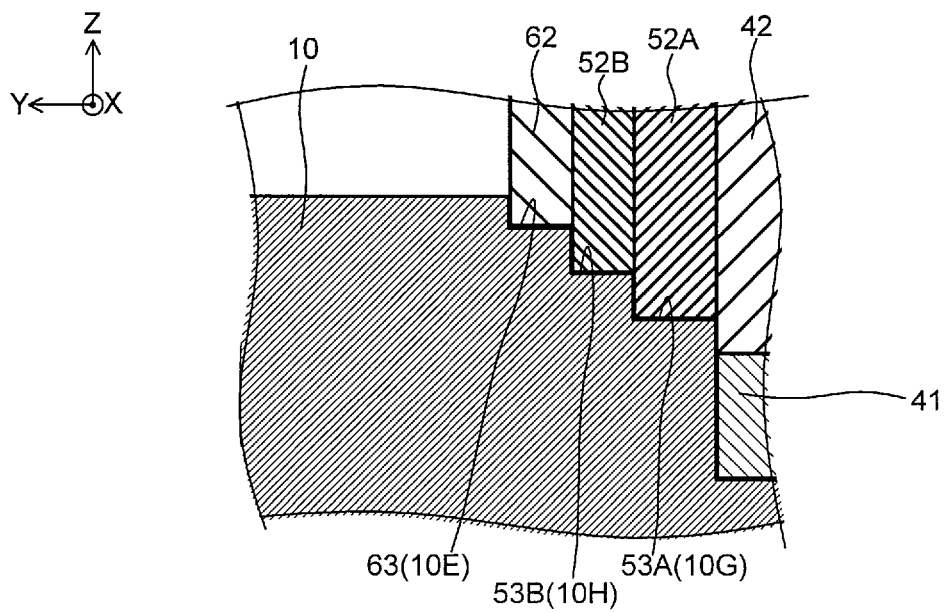
FIG. 14 is an enlarged view showing part of the connection structure of the high-frequency transmission line shown in FIG. 12.
Figure 15:
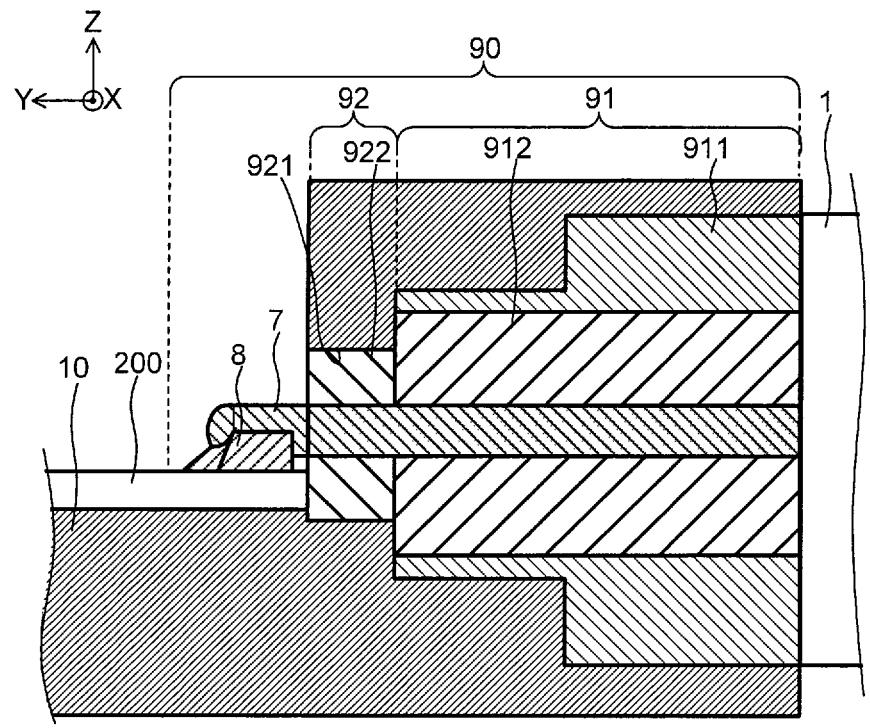
FIG. 15 is a view showing the sectional shape of the side surface of a conventional connection structure of a high-frequency transmission line.
Figure 16:
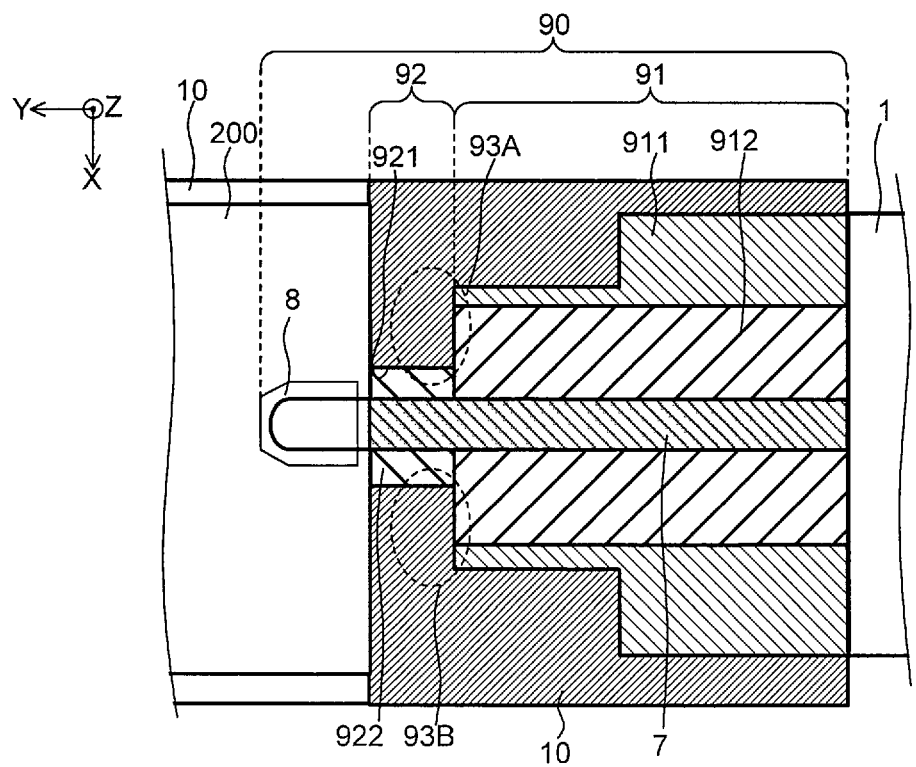
FIG. 16 is a view showing the sectional shape of the upper surface of the conventional connection structure of the high-frequency transmission line.

FIGS. 12 to 14 are views each showing a connection structure of a high-frequency transmission line according to the third embodiment.

FIG. 12 shows the sectional shape of the side surface of a connection structure 23 of the high-frequency transmission line according to the third embodiment. FIG. 13 is a plan view showing the connection structure 23 of the high-frequency transmission line when viewed from a Y direction. FIG. 14 is an enlarged view showing a partial region of the connection structure 23 shown in FIG. 12.

The connection structure 23 of the high-frequency transmission line according to the third embodiment is different from the connection structure 13 of the high-frequency transmission line according to the second embodiment in that a plurality of buffer blocks of different sizes are included. The remaining structures are the same as that of in the connection structure 13 of the high-frequency transmission line according to the second embodiment. Note that in the connection structure 23 according to the third embodiment, the same reference numerals as in the connection structure 13 according to the second embodiment denote the same constituent elements and a detailed description thereof will be omitted.

More specifically, as shown in FIGS. 12 to 14, the connection structure 23 of the high-frequency transmission line according to the third embodiment includes two buffer blocks 25A and 25B arranged in the Y-axis direction between a coaxial mode block 4 and a coplanar mode block 6. The buffer blocks 25A and 25B are coaxially arranged.

The buffer block 25A includes an outer conductor 53A and a dielectric body 52A. Similarly to the outer conductor 53 according to the second embodiment, the outer conductor 53A is coaxially spaced apart from a central conductor 7 between outer conductors 41 and 63 in the axial direction of the central conductor 7. More specifically, the outer conductor 53A includes a hole 10G that is formed coaxially with the central conductor 7 and is larger than the outer diameter of the central conductor 7, and is arranged between the outer conductors 41 and 63.

In the third embodiment, as an example, by forming the hole 10G in a metal member 10, a partial region of the metal member 10, where the hole 10G is formed, is used as the outer conductor 53A, similarly to the outer conductor 51 according to the first embodiment. The dielectric body 52A is filled between the outer conductor 53A and the central conductor 7.

As shown in, for example, FIG. 13, the hole 10G is formed into a circular shape when viewed from the Y-axis direction. More specifically, when viewed from the Y-axis direction, the hole 10G (dielectric body 52A) has a circular shape with a diameter smaller than that of a hole 10A of the coaxial mode block 4 (the outer circumferential circle of a dielectric body 42), and is arranged inside a region filled with the dielectric body 42 of the coaxial mode block 4.

The buffer block 25B includes an outer conductor 53B and a dielectric body 52B. Similarly to the outer conductor 53 according to the second embodiment, the outer conductor 53B is coaxially spaced apart from the central conductor 7 between the outer conductors 41 and 63 in the axial direction of the central conductor 7.

More specifically, the outer conductor 53B includes a hole 10H that is formed coaxially with the central conductor 7 and is larger than the outer diameter of the central conductor 7, and is arranged between the outer conductors 41 and 63.

In the third embodiment, as an example, by forming the hole 10H in the metal member 10, a partial region of the metal member 10, where the hole 10H is formed, is used as the outer conductor 53B, similarly to the outer conductor 53A. The dielectric body 52B is filled between the outer conductor 53B and the central conductor 7.

As shown in, for example, FIG. 13, the hole 10H is formed into a circular shape when viewed from the Y-axis direction. More specifically, when viewed from the Y-axis direction, the hole 10H (dielectric body 52B) has a circular shape with a diameter smaller than that of the hole 10A of the coaxial mode block 4 (the outer circumferential circle of the dielectric body 42), and is arranged inside the region filled with the dielectric body 42 of the coaxial mode block 4. The diameter of the hole 10H is smaller than that of the hole 10G.

Similarly to the high-frequency transmission line according to the first embodiment, a buffer block 15 and a coplanar mode block 16 are arranged so that the lengths in the X-axis direction (widthwise direction) of the outer conductors 41, 53A, 53B, and 63 in a signal path from the axial mode to the coplanar mode gradually decrease. More specifically, as shown in FIG. 13, when, in a direction (X direction) perpendicular to each of the axial direction (Y direction) of the central conductor 7 and a direction (Z direction) perpendicular to a planar transmission line 2, a shortest distance between the central conductor 7 and the outer conductor 41, that of between the central conductor 7 and the outer conductor 53A, that of between the central conductor 7 and the outer conductor 53B, and that of between the central conductor 7 and the outer conductor 63 are represented by x1, xa, xb, and x3, respectively, $x3<xb<xa<x1$ holds.

As shown in FIG. 14, the hole 10G is filled with the dielectric body 52A, and the hole 10H is filled with the dielectric body 52B. The dielectric bodies 52A and 52B may be made of the same dielectric material or different dielectric materials, and the present invention is not particularly limited. For example, both of the dielectric bodies 52A and 52B may be air (relative dielectric constant: about 1.0) or a fluororesin (relative dielectric constant: 2.0 to 3.0).

Furthermore, a fluororesin may be used as the dielectric body 52A on the side of the coaxial mode block 4, and air may be used as the dielectric body 52B on the side of the coplanar mode block 6. This facilitates smoother switching between the coaxial mode and the coplanar mode.

Similarly to the connection structures 3 and 13 according to the first and second embodiments, the connection structure 23 of the high-frequency transmission line according to the third embodiment can prevent an electric field from being concentrated at the boundary portion between the coaxial mode block 4 and the coplanar mode block 6, thereby suppressing deterioration in transmission characteristic.

Furthermore, since the connection structure 23 of the high-frequency transmission line according to the third embodiment is provided with the plurality of buffer blocks, it is easy to finely adjust the characteristic impedance.

The invention made by the present inventors has been described in detail above based on the embodiments. However, the present invention is not limited to them, and various changes can be made without departing from the spirit of the invention, as a matter of course.

For example, the above embodiments have exemplified a case in which the dielectric body 52 forming the buffer block 5 is air. The present invention, however, is not limited to this, and another dielectric material may be used in accordance with the target characteristic impedance. Similarly, the dielectric body 42 of the coaxial mode block 4 or the dielectric body 62 of the coplanar mode block 6 is not limited to the above-described glass material, and another dielectric material such as air may be used.

The above embodiments have exemplified a case in which the connector 40 convex in the Y-axis direction is used as the coaxial mode block 4. The present invention, however, is not limited to this. For example, the connector 40 may be formed into one tubular shape (R1=R2). A portion of the metal member 10 may be used as the outer conductors 41 and 42 by processing the metal member 10 in accordance with the shape of the connector 40 without providing the connector 40. In this case, the processed metal member 10 need only be directly filled with the dielectric body 42.

The above embodiments have exemplified a case in which the inner walls of the holes formed in the metal member 10 are used as the outer conductor 51 of the buffer block and the outer conductor 61 of the coplanar mode block 6. The present invention, however, is not limited to this.

For example, a connector formed from dielectric bodies forming the outer conductors 51 and 61, like the connector 40, may be prepared, and arranged in the holes 10B and 10C formed in the metal member 10. Alternatively, a connector forming the outer conductors 51 and 61 may be fixed onto the metal member 10 without forming the holes 10B and 10C in the metal member 10. In this case, similarly to the central conductor 7, examples of the dielectric bodies forming the connector can be metallic materials such as copper or kovar.

The third embodiment has exemplified a case in which the two buffer blocks 25A and 25B are provided between the coaxial mode block 4 and the coplanar mode block 6. However, the number of buffer blocks is not limited to two, and may be three or more.

Figure 17:
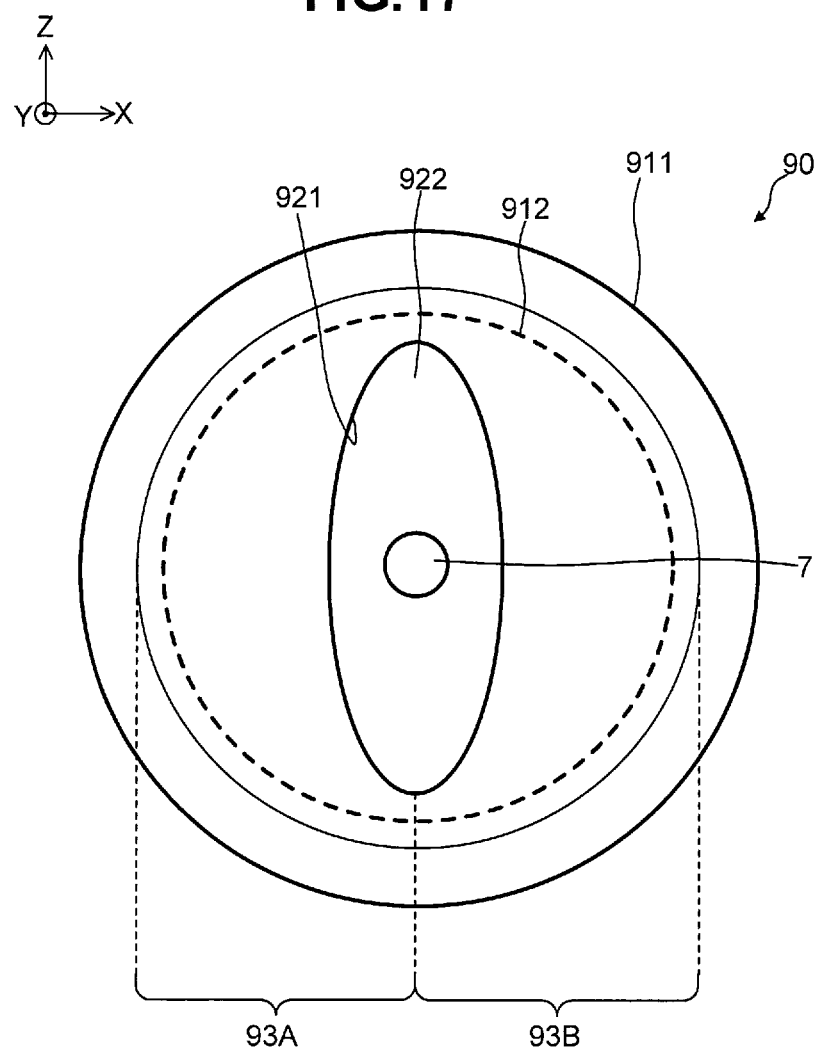
FIG. 17 is a front view showing the conventional connection structure of the high-frequency transmission line.

The shapes of the outer conductors 51, 53, 53A, 53B, 61, and 63 are not limited to the rectangular shape or the circular shape as long as the lengths in the X-axis direction (widthwise direction) of the outer conductors in the signal path from the coaxial mode to the coplanar mode gradually decrease. For example, as shown in FIG. 17, each of the outer conductors 61 and 63 may have an elliptic shape in which the length in the Z-axis direction is longer than that of in the X-axis direction when viewed from the Y-axis direction.

INDUSTRIAL APPLICABILITY

The connection structure of the high-frequency transmission line according to the present invention can be applied as a connection structure of a high-frequency transmission line for transmission of a high-frequency signal such as a microwave or millimeter wave signal.

EXPLANATION OF THE REFERENCE NUMERALS AND SIGNS

1 . . . coaxial line, 2 . . . planar transmission line, 200 . . . substrate, 201 . . . signal wiring, 202 . . . ground wiring, 3, 13, 23 . . . connection structure, 4 . . . coaxial mode block, 5, 15, 25A, 25B . . . buffer block, 6, 16, 26A, 26B . . . coplanar mode block, 7 . . . central conductor, 8 . . . pedestal, 10 . . . metal member, 10A, 10B, 10C, 10E, 10F, 10G, 10H . . . hole, 41, 51, 53, 53A, 53B, 61, 63, 63A, 63B . . . outer conductor, 42, 52, 52A, 52B, 62 . . . dielectric body, 62 . . . dielectric body, 411 . . . first tubular portion, 412 . . . second tubular portion

The invention claimed is:

1. A connection structure of a high-frequency transmission line that connects a coaxial line and a planar transmission line, comprising:
a columnar central conductor having one end connected to an inner conductor of the coaxial line and the other end connected to the planar transmission line;
a coaxial mode block electrically connected to the coaxial line;
a coplanar mode block electrically connected to the planar transmission line;
a buffer block arranged between the coaxial mode block and the coplanar mode block,
the coaxial mode block including
a first outer conductor including a first hole that is formed coaxially with the central conductor and is larger than an outer diameter of the central conductor, and arranged on a side of the one end of the central conductor, and
a first dielectric body filled between the central conductor and the first outer conductor,
the coplanar mode block including
a second outer conductor including a second hole that is formed coaxially with the central conductor and is larger than the outer diameter of the central conductor, and arranged on a side of the other end of the central conductor, and
a second dielectric body filled between the central conductor and the second outer conductor, and
the buffer block including
a third outer conductor including a third hole that is formed coaxially with the central conductor and is larger than the outer diameter of the central conductor, and arranged between the first outer conductor and the second outer conductor, and
a third dielectric body filled between the central conductor and the third outer conductor,
wherein in a direction perpendicular to each of an axial direction of the central conductor and a direction perpendicular to the planar transmission line, a shortest distance between the central conductor and the first outer conductor is longer than a shortest distance between the central conductor and the third outer conductor, and the shortest distance between the central conductor and the third outer conductor is longer than a shortest distance between the central conductor and the second outer conductor,
in the direction perpendicular to the planar transmission line, a shortest distance between the central conductor and the first outer conductor is longer than a shortest distance between the central conductor and the third outer conductor, and a shortest distance between the central conductor and the second outer conductor is longer than the shortest distance between the central conductor and the first outer conductor, and
the third dielectric body is arranged inside a region filled with the first dielectric body when viewed from the axial direction of the central conductor.

2. The connection structure of the high-frequency transmission line according to claim 1, wherein the third hole is formed from a plurality of holes having different sizes and arranged in the axial direction of the central conductor.

3. The connection structure of the high-frequency transmission line according to claim 1, wherein the third dielectric body is air.

4. The connection structure of the high-frequency transmission line according to claim 3, wherein the third hole is formed from a plurality of holes having different sizes and arranged in the axial direction of the central conductor.

5. The connection structure of the high-frequency transmission line according to claim 1, wherein the second outer conductor and the third outer conductor are integrally formed by a single metal member.

6. The connection structure of the high-frequency transmission line according to claim 5, wherein the third hole is formed from a plurality of holes having different sizes and arranged in the axial direction of the central conductor.

7. The connection structure of the high-frequency transmission line according to claim 5, wherein the third dielectric body is air.

8. The connection structure of the high-frequency transmission line according to claim 7, wherein the third hole is formed from a plurality of holes having different sizes and arranged in the axial direction of the central conductor.

* * * * *